US007264909B2

(12) United States Patent
Nakasugi

(10) Patent No.: US 7,264,909 B2
(45) Date of Patent: Sep. 4, 2007

(54) EXPOSURE PARAMETER OBTAINING METHOD, EXPOSURE PARAMETER EVALUATING METHOD, SEMICONDUCTOR DEVICE MANUFACTURING METHOD, CHARGED BEAM EXPOSURE APPARATUS, AND METHOD OF THE SAME

(75) Inventor: Tetsuro Nakasugi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 11/268,526

(22) Filed: Nov. 8, 2005

(65) Prior Publication Data

US 2006/0063078 A1 Mar. 23, 2006

Related U.S. Application Data

(62) Division of application No. 10/122,393, filed on Apr. 16, 2002, now Pat. No. 7,011,915.

(30) Foreign Application Priority Data

Apr. 16, 2001 (JP) ............................. 2001-117162

(51) Int. Cl.
*G03C 5/00* (2006.01)
*G03F 9/00* (2006.01)

(52) U.S. Cl. .................. 430/30; 430/296; 430/312; 430/328; 430/394; 430/396; 430/942

(58) Field of Classification Search ................ 430/30, 430/296, 312, 328, 394, 396, 942; 250/491.1, 250/492.2, 492.22, 492.3
See application file for complete search history.

(56) References Cited

U.S. PATENT DOCUMENTS

| 4,670,650 | A | 6/1987 | Matsuzawa et al. |
| 5,831,273 | A | 11/1998 | Someda et al. |
| 5,989,759 | A | 11/1999 | Ando et al. |
| 5,994,030 | A | 11/1999 | Sugihara et al. |
| 6,376,136 | B1 | 4/2002 | Nakasugi et al. |
| 6,818,364 | B2 | 11/2004 | Nakasugi |

FOREIGN PATENT DOCUMENTS

| JP | 60-249327 | 12/1985 |
| JP | 6-260401 | 9/1994 |
| JP | 07-022349 | 1/1995 |
| JP | 07-169667 | 7/1995 |
| JP | 10-303125 | 11/1998 |
| JP | 11-162390 | 6/1999 |
| JP | 2000-124115 | 4/2000 |
| JP | 2000-182942 | 6/2000 |

OTHER PUBLICATIONS

Nakasugi, T., "Charged Particle Beam Exposure Apparatus and Exposure Method", U.S. Appl. No. 10/092,161, filed Mar. 7, 2002, Specification—49 pages, and 20 sheets of drawings.
Nakasugi, T., et al., "Pattern Observation Apparatus and Pattern Observation Method", U.S. Appl. No. 09/669,732, filed Sep. 26, 1999, Specification—54 pages, and 11 sheets of drawings.
Nakasugi, T., et al., "Charged Beam Exposure Method and Charged Beam Exposure Apparatus", U.S. Appl. No. 09/465,932, filed Dec. 17, 1999, Specification—49 pages, and 12 sheets of drawings.
Nakasugi, T., et al., "Alignment System Using Voltage Contrast Images for Low-Energy Electron-Beam Lithography", J. Vac. Sci. Technol. B 19(6), pp. 2869-2873, (Nov. 2001).
Notification of Reasons for Rejection mailed Apr. 24, 2007, issued by the Japanese Patent Office, mailed Apr. 24, 2007, in Japanese Patent Application No. 2002-110208, and English Translation of Notification.

*Primary Examiner*—Christopher G. Young
(74) *Attorney, Agent, or Firm*—Finnegan, Henderson, Farabow, Garrett & Dunner, L.L.P.

(57) ABSTRACT

An exposure parameter obtaining method comprising forming a charged reference pattern and a plurality of charged exposure patterns at a surface region of a to-be-exposed insulation substrate by projecting a charged beam with a first incident energy using a reference pattern whose exposure parameter has been known beforehand and all of selected exposure patterns to be corrected, forming electron signal images for the charged reference pattern and the plurality of charged exposure patterns on the basis of charged particles including secondary electrons by scanning the surface of the insulation substrate with a charged beam with a second incident energy lower than the first incident energy, and creating, on the basis of the electron signal images, the exposure parameters including at least one of position, focal point, astigmatism, rotation, and magnification for all of the selected exposure patterns to be corrected.

4 Claims, 12 Drawing Sheets

EXPOSURE PARAMETER OBTAINING METHOD, EXPOSURE PARAMETER EVALUATING METHOD, SEMICONDUCTOR DEVICE MANUFACTURING METHOD, CHARGED BEAM EXPOSURE APPARATUS, AND METHOD OF THE SAME

CROSS-REFERENCE TO RELATED APPLICATIONS

This is a divisional of application Ser. No. 10/122,393, filed Apr. 16, 2002 now U.S. Pat. No. 7,011,915, the entire contents of which are incorporated herein by reference.

This application is based upon and claims the benefit of priority from the prior Japanese Patent Application No. 2001-117162, filed Apr. 16, 2001, the entire contents of which are incorporated herein by reference.

BACKGROUND OF THE INVENTION

1. Field of the Invention

This invention relates to an exposure parameter obtaining method in charged beam exposure using electron beams or the like, an exposure parameter evaluating method, a semiconductor device manufacturing method, a charged beam exposure apparatus and to a method of the same.

2. Description of the Related Art

With the recent higher-density packaging of large-scale semiconductor integrated circuits, charged beam exposure apparatuses using a charged particle beam, such as an electron beam, have been put to practical use. For instance, an electron beam exposure apparatus uses a variably shaped beam (VSB) obtained by variably shaping the cross section of an electron beam generated at an electron beam source. The variably shaped beam is directed onto a waver surface and deflected for scanning on the surface of the wafer according to a pattern data, thereby drawing a desired pattern. That is, this type of electron beam exposure apparatus has a pattern generation function of forming a pattern, hardware, on the waver from the pattern data, software.

Since the electron beam exposure apparatus draws a pattern by connecting exposure shots on the wafer with a variably shaped beam whose cross section has been shaped into, for example, a rectangle or a triangle, the smaller the pattern size to be drawn, the electron beam generally has to be the finer. As a result, the number of exposure shots per unit area increases and therefore the throughput tends to decrease.

On the other hand, in the case of manufacturing a semiconductor device, such as memory, which needs ultrafine pattern exposure, although patterns to be exposed are fine, most of them are often composed of repetitions of basic patterns. Therefore, if a basic pattern or a character pattern, a unit of repetitive pattern, is generated by a single shot, such an ultra-fine pattern could be exposed with a relatively high throughput, even when the basic pattern is rather complex.

Therefore, instead of an exposure method using a variably shaped beam, an electron beam exposure apparatus is being put to practical use which is performed by employing a drawing method using basic pattern projection techniques. In this method, such basic pattern is called a character. In the exposure apparatus, an electron beam is projected onto the wafer through a selected aperture having a character shape of a beam shaping mask. The mask has a plurality of basic patterns, or a plurality of characters, and is called as a character projection pattern (hereinafter, referred to as a CP pattern) mask, thereby producing an electron beam having a basic pattern section of a desired shape with a single shot.

As described above, an electron beam exposure apparatus is being put to practical use which has employed a drawing method using character projection techniques for connecting basic pattern shots by exposing the patterns repeatedly, and thereby achieving a practically high throughput.

The total wafer drawing time of the electron beam exposure apparatus is expressed roughly by the product of an exposure time required to expose a single character and the number of shots. Therefore, when the resist sensitivity is raised and the beam current density is increased to shorten the shooting time and the beam size is made larger to decrease the number of shots, the drawing time is shortened. Since the character projection technique (hereinafter, referred to as the CP technique) for transferring basic patterns repeatedly decreases the number of shots, it has a higher throughput than that of the variably shaped beam technique (referred to as the VSB technique). When several hundreds CP patterns are formed on a single mask, the frequency of mask replacement decreases, which improves the throughput remarkably. The exposure method using the conventional CP technique, however, has the following problem.

In the electron beam exposure apparatus using the CP technique, before exposure a wafer by an electron beam, the electron beam passed through each CP pattern aperture selected from a single CP pattern mask has to be so adjusted that the beam reaches a specific position with respect to a reference pattern previously defined on the wafer. If there is any one of a shift in position, rotation, blurring, and a fluctuation in the magnification in the CP pattern drawn on the wafer by the electron beam, accurate pattern exposure is impossible for the CP pattern. Accordingly, it is very important to correct or offset the position on the wafer of the electron beam passed through each aperture corresponding to each CP pattern.

In a conventional method of correcting the position of the CP pattern, for example, an area including a microscopic mark made of a heavy metal put on a wafer is scanned with an electron beam generated at an exposure apparatus. Then, secondary electrons generated at the microscopic mark at that time are detected to obtain an electron signal image of the electron beam shape or CP pattern. Then, pattern matching between the obtained image and a reference pattern is effected. From the difference in position between them, the amount of correction of the beam exposure position, or exposure parameter, is determined.

In a conventional method, it is necessary to generate an electron signal image of each CP pattern by scanning the electron beam repeatedly over each pattern selected from the mask and used for exposure. As a result, it takes a lot of time to adjust the position of each CP pattern and accordingly it is virtually difficult to obtain the exposure parameter for each of several hundreds CP patterns.

BRIEF SUMMARY OF THE INVENTION

According to an aspect of the present invention, there is provided an exposure parameter obtaining method comprising: selecting a plurality of exposure patterns to be used for exposing from an exposure mask with a reference pattern whose exposure parameter has been known beforehand; forming a charged reference pattern and a plurality of charged exposure patterns at a surface region of a to-be-exposed insulation substrate by projecting a charged beam with a first incident energy using the reference pattern and all of the selected exposure patterns to be corrected; forming electron signal images for the charged reference pattern and the plurality of charged exposure patterns on the basis of charged particles including secondary electrons by scanning the surface of the insulation substrate with a charged beam with a second incident energy lower than the first incident energy; and creating, on the basis of the electron signal images, the exposure parameters including at least one of position, focal point, astigmatism, rotation, and magnification for all of the selected CP patterns to be corrected.

DETAILED DESCRIPTION OF THE INVENTION

Hereinafter, referring to the accompanying drawings, embodiments of the present invention will be explained in detail.

FIRST EMBODIMENT

Figure 1:
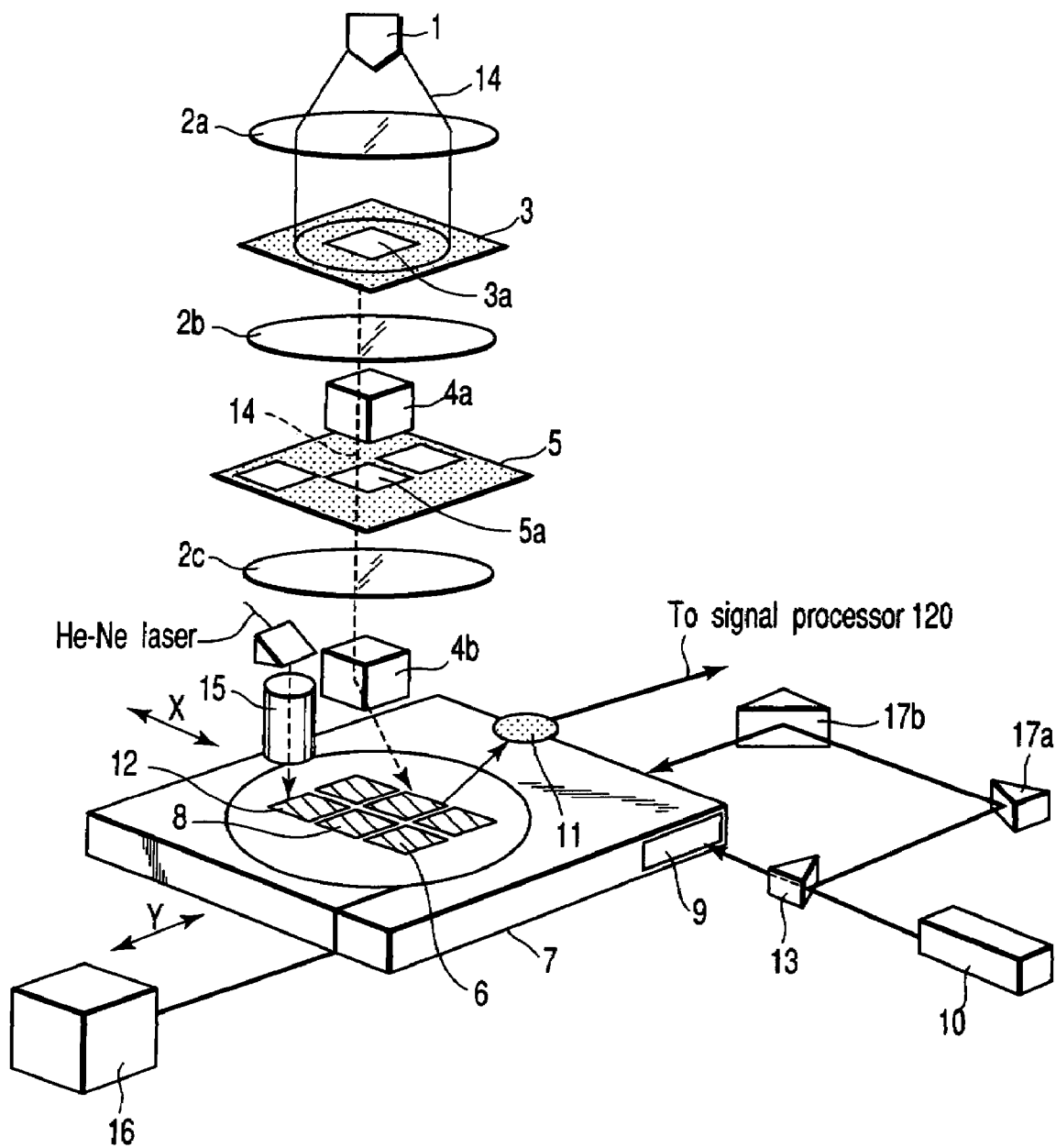
FIG. 1 schematically shows an electron beam exposure apparatus used in an electron beam exposure method according to a first embodiment of the present invention.

FIG. 1 schematically shows an electron beam exposure apparatus related to a first embodiment of the present invention. This apparatus is a variably shaped, CP electron beam exposure apparatus with an acceleration voltage of 5 kV.

An electron beam 14 emitted from an electron gun 1 is caused to converge by a lens 2a such as an electrostatic lens and passes through an aperture 3a of, for example, a rectangular pattern in a first aperture mask 3. The electron beam 14 passed through the aperture 3a in the first aperture mask 3 is formed into a shape whose cross section is rectangular. The resulting electron beam is further caused to converge by a lens 2b and directed to a deflector 4a. Thereafter, the electron beam is deflected and projected to, for example, a rectangular CP pattern aperture 5a in a second aperture mask 5. As described above, the electron beam 14 with a rectangular cross-section formed with the first aperture mask 3 is deflected by the deflector 4a over the rectangular CP pattern in the second aperture mask 5, thereby realizing an electron beam with a rectangular cross section of a desired size. Similarly, the electron beam is so deflected that it passes through a CP pattern aperture of another shape in the second aperture mask 5, for example, a triangular aperture, thereby producing an electron beam with a triangular cross section as a basic pattern from the second aperture mask 5. Thus, the electron beam passed through the mask 5 has a basic pattern.

The electron beam of the basic pattern passed through the second aperture mask 5 is deflected back by a deflector (not shown) onto the beam center axis going through an aperture 3A in the first aperture mask 3. Then, the section of the electron beam thus centered is reduced and caused to converge by a reduced projection lens objective 2c. The electron beam from the lens 2c is further deflected by a deflector 4b and projected at the specified position of a chip 8 on a wafer 6 on a stage 7 of the electron beam exposure apparatus. At the specified chip 8 on the wafer 6, a mark 12 of a heavy metal, for example, is formed.

A mirror 9 is provided on one side face of the stage 7 perpendicular to, for example, the x direction. The mirror 9 is so configured that a laser beam from a laser interferometer 10 is split by a beam splitter 13 and projected onto the mirror 9. The other laser beam split by the beam splitter 13 passes through reflectors 17a, 17b and are projected onto a mirror provided on another side face of the stage 7 in the y direction perpendicular to the mirror 9. With this configuration, the laser beams reflected by the two mirrors are caused to enter the laser interferometer 10, which enables the positions in the x and y directions of the stage 7 to be measured at all times.

Above the stage 7, there is provided an electron detector 11. The electron detector 11 detects secondary electrons generated when the mark 12 and the surface of an insulation film formed on the chip 8 are scanned with the electron beam 14. The detection output signal of the electron detector 11 is sent to a signal processing unit 120 of FIG. 2, which produces an electron signal image of an exposure pattern formed on the wafer 6 or the chip 8. This will be explained in detail later.

The apparatus is further provided with an off-axis microscope 15. A He—Ne laser directed from a laser source (not shown) is supplied to the off-axis microscope 15. By using the He—Ne laser, the focal point of the mark 12 on the wafer 6 is measured exactly, thereby detecting the position of the mark 12 on the wafer 6 in X, Y and Z directions.

The apparatus is further provided with a power supply 16 for applying a specific voltage to the wafer 6 via the stage 7. When the power supply 16 applies, for example, a voltage of 4 kV to the wafer 6, this makes it possible to set the energy (or incident energy) of the electron beam 14 incident on the wafer 6 to a low energy of about 1 kV.

Figure 2:
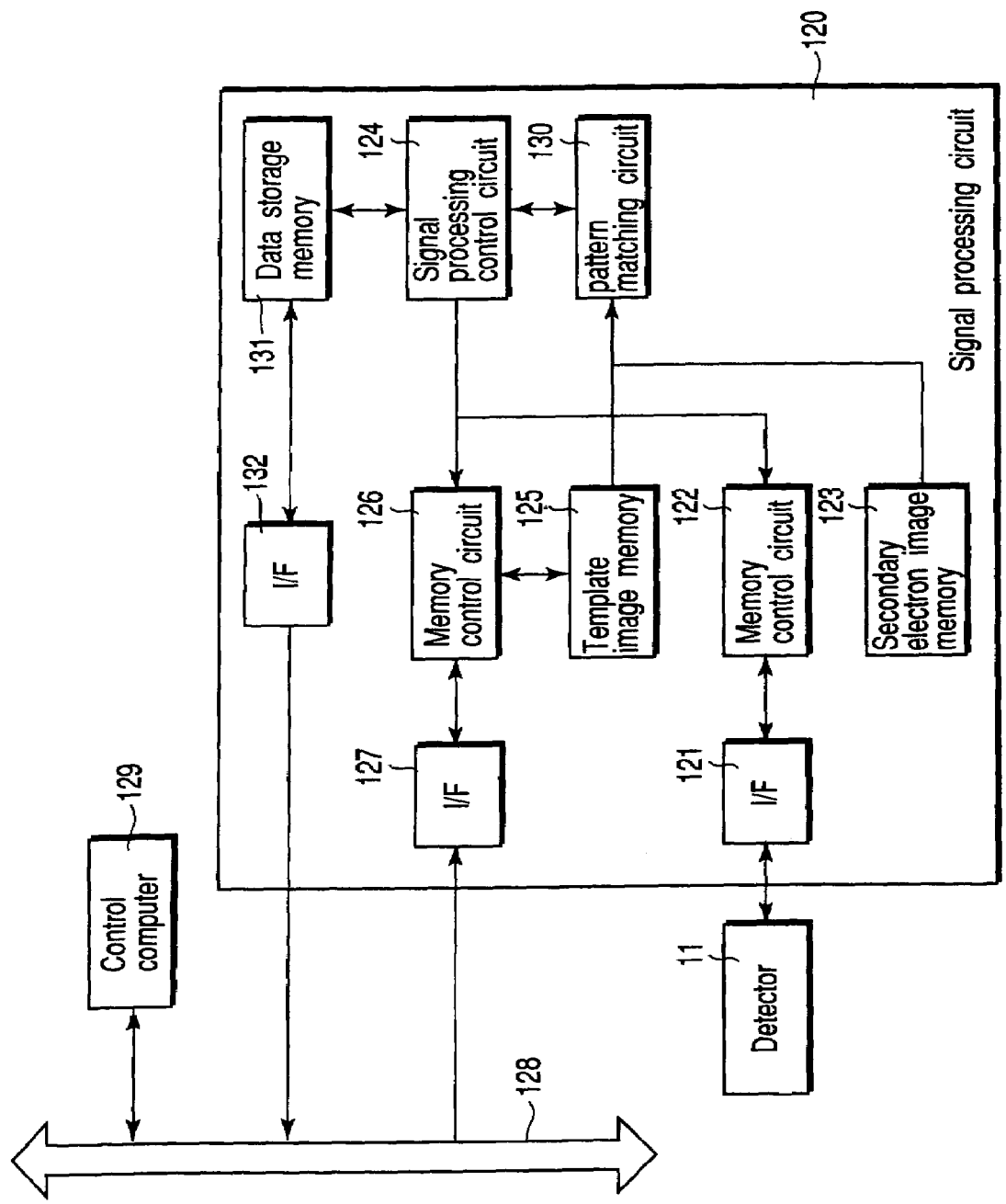
FIG. 2 is a block diagram showing the configuration of a signal processing circuit section for generating exposure parameters from the secondary electron detection signal detected at the detector of FIG. 1.
Figure 3:
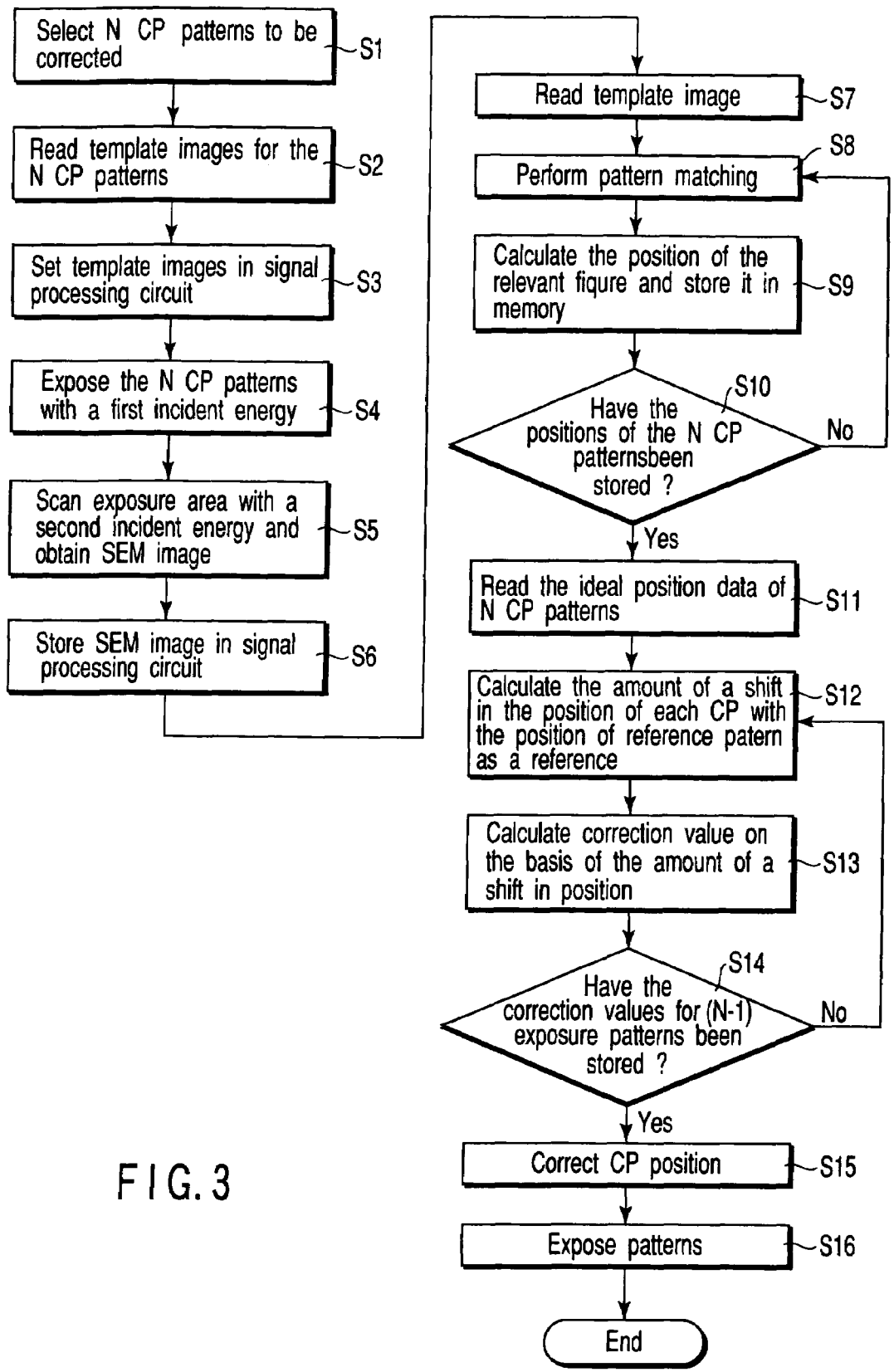
FIG. 3 is a flowchart to help explain an exposure parameter obtaining method in the first embodiment.

In FIG. 2, a secondary electron detection signal generated at the electron detector 11 is supplied to an interface (I/F) 121 in a signal processing circuit 120, which subjects the signal to processes, including A/D conversion and noise removal and converts the signal into digital data. Under the control of a memory control circuit 122, the digital data is stored in an image memory 123 in the form of secondary electron image data. The memory control circuit 122 is connected to a signal processing control circuit 124, which controls the memory control circuit 122.

On the other hand, to perform pattern matching with the secondary image data stored in the image memory 123, template image data has been stored in a template image memory 125 beforehand. A memory control circuit 126 controlled by the signal processing control circuit 124 controls the template image memory 125 in which, for example, an N number of template image data items corresponding to a plurality of CP patterns formed at the second aperture mask 5 have been stored beforehand. In this case, the N template image data items include a data item corresponding to a CP pattern defined as a reference pattern and those data items corresponding to CP patterns being used to form exposed CP patterns on the chip 8.

For example, the memory control circuit 126 is connected to a control computer 129 in the electron beam exposure apparatus of FIG. 1 via an interface (I/F) 127 and a bus 128. The control computer 129 generates a plurality of template image data items on the basis of the CP pattern design data used when generating each CP pattern at the second aperture mask 5 and stores them in the template image memory 125 via the interface (I/F) 127 and memory control circuit 126. Alternatively, normalized CP patterns of a heavy metal may be formed on a wafer by experiments and scanned with an electron beam, thereby obtaining template image data from the resulting secondary electron signal. Furthermore, since the secondary electron detection signal obtained from the electron detector 11 may have a blurred outline of the pattern, the template image data may be stored in the form of blurred image data in order to perform pattern matching with the blurred-outline detection signal efficiently. For instance, the CP pattern design data may be converted into blurred image data by Gaussian convolution, which may be stored in the template image memory 125.

The detected secondary electron image data stored in the image memory 123 and the template image data stored in the template image memory 125 are supplied to a pattern matching circuit 130, which performs pattern matching under the control of the signal processing control circuit 124. In the pattern matching, for example, the template image data is moved sequentially with respect to the detected image data to find out a matching position. The position data at which the matching is completed is read out at the signal processing control circuit 124. In other words, the position data thus obtained denotes a mutual positional deviation between the detected image and the corresponding template image.

The position data denoting positional differences between each of the detected image data and the corresponding template image data obtained in this way is stored in the data storage memory 131.

On the other hand, reference data denoting reference positional differences between a reference pattern and design data of the template patterns are formed and stored beforehand in the control computer 129. The position data stored in the data storage memory 131 and the reference data stored in the control computer 129 are used to determine positional deviations of the exposed CP patterns as will be described later.

Data items representing the determined positional deviations is stored in the control computer 129 and is used as exposure parameter data. The stored parameter data is read when the exposure apparatus operates to expose the CP patterns on the chip 8.

Figure 4:
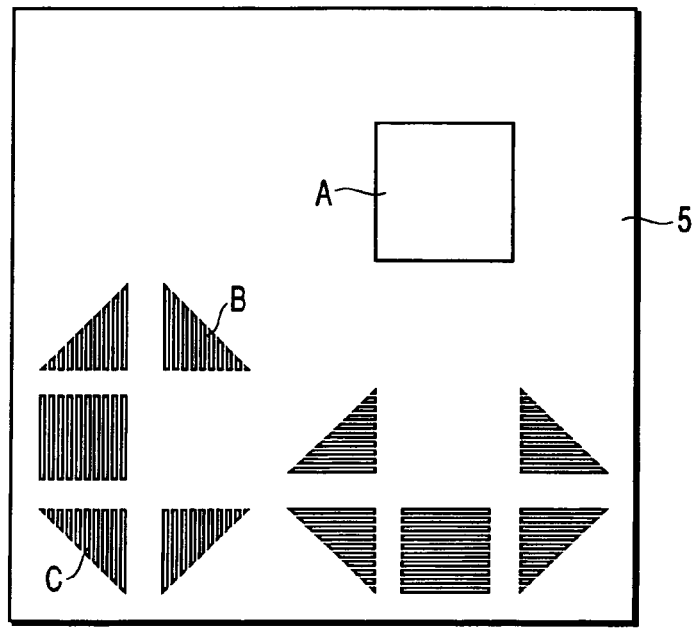
FIG. 4 shows an example of the apertures of a plurality of CP patterns selected on an exposure mask in the first embodiment.

Hereinafter, referring to FIGS. 2, 3, and 4, FIGS. 5A to 5C, and FIGS. 6A to 6C, a method of obtaining exposure parameters in the first embodiment using the electron beam exposure apparatus of FIG. 1 will be described. In this method, a specific CP pattern or a reference pattern whose absolute position has been corrected beforehand is used. For example, the exposure pattern corresponding to CP pattern A of FIG. 4 is used as the reference pattern. As for other CP patterns B and C, a relative difference in position between each exposure pattern stored in the secondary electron image memory 123 and the reference pattern is determined in the form of an exposure parameter. After the shift in position is corrected using the obtained exposure parameter, exposure is made.

First, the wafer 6 is placed on the stage 7. Then, in step S1 in the flowchart of FIG. 3, CP pattern apertures used for wafer exposure, that is, N number of apertures for the CP patterns to be corrected, are selected on the control computer 129 from the CP pattern apertures formed in the selected second aperture mask 5. Here, it is assumed that a triangular CP pattern B and a triangular CP pattern C obtained by rotating the CP pattern B through an angle of 180 degrees are selected with a rectangular CP pattern A of FIG. 4 as a reference.

Therefore, CP pattern A is defined as a pattern already subjected to absolute position correction (or a reference pattern). The pattern data is read as template image data in the control computer 129. In this case, with the reference pattern A as a reference, CP pattern B and CP pattern C have been selected in step S1 as CP patterns to be corrected. Therefore, in step S2, the template image data item corresponding to CP pattern B and the template image data item corresponding to CP pattern C are read together with that corresponding to the CP pattern A in the control computer 129.

The template image data read in this way is transferred via the I/F 127 of the signal processing circuit 120 to the memory control circuit 126 and is stored in the template image memory 125 in step S3.

Next, in step S4, the deflector 4a is so operated that the electron beam passes through CP pattern apertures A, B and C in the second aperture mask 5. This causes the electron beam 14 with an incident energy (or first incident energy) of 5 keV to be projected at a predetermined position on a resist layer 53 applied on an insulating film 52, such as a silicon oxide film, formed on the wafer 6 of FIG. 6A so as to take the form of CP patterns A, B and C. With this projection, exposure patterns for CP patterns A, B and C are formed at the resist layer 53 as charged patterns or charge accumulated patterns (described later).

Figure 6A:
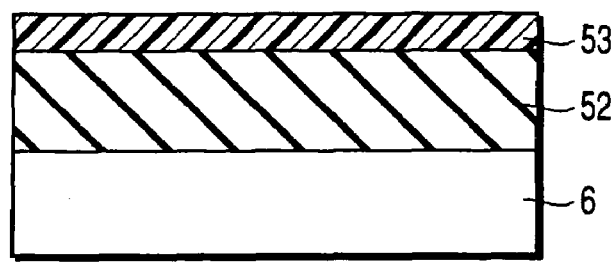
FIGS. 6A to 6C are sectional views showing changes in the state of the inside of the substrate when a voltage contrast image is obtained as a result of a specimen (an exposed substrate) being subjected to beam exposure in the first embodiment.
Figure 6B:
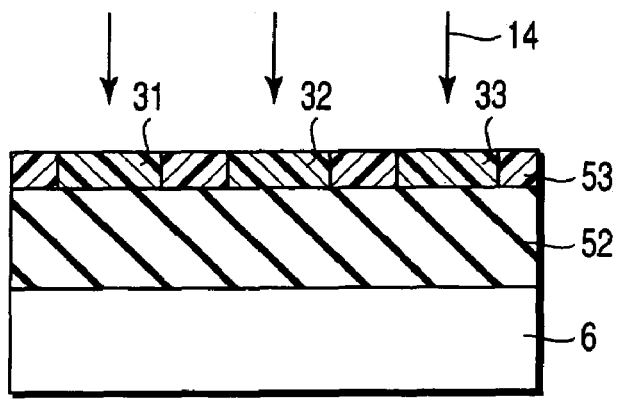

FIG. 6B is a sectional view of the exposed substrate wafer 6, a specimen in step S4. In FIG. 6B, numerals 31, 32, and 33 indicate, for example, regions exposed with the exposure patterns A, B and C at the resist layer 53.

Figure 5A:
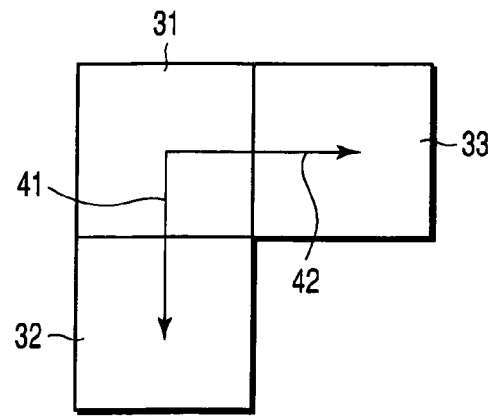
FIGS. 5A to 5C are diagrams to help explain a method of correcting the position of a CP pattern in the first embodiment.
Figure 5B:
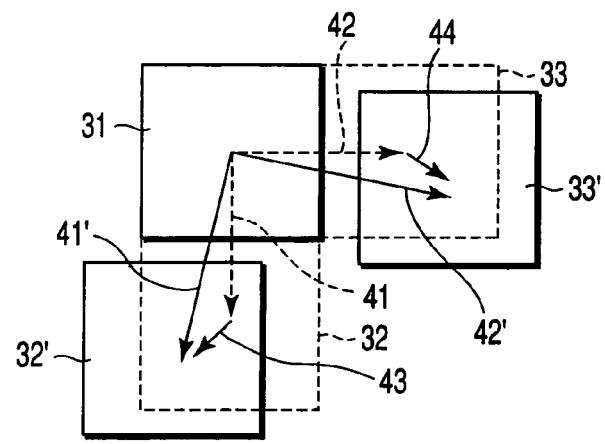
Figure 5C:
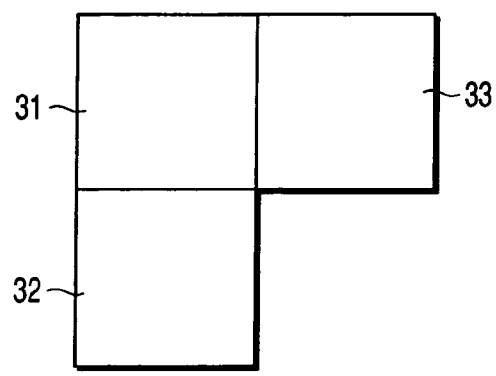

FIG. 5A shows an ideal positional relationship between a reference exposure pattern 31 and exposure patterns 32 and 33 when the position of CP pattern B and that of CP pattern C have been corrected ideally with respect to the reference exposure pattern 31. In FIG. 5A, arrows 41 and 42 are relative vectors showing the positional relationship between exposure pattern 31 and exposure pattern 32 and between exposure pattern 31 and exposure pattern 33. In FIGS. 5A to 5C, the figures inside the exposure patterns 31, 32 and 33 corresponding to CP patterns A to C are omitted for the sake of simplification.

Next, using the power supply 16, a voltage of 4 kV is applied to the wafer 6 in step S5. This decreases the necessary energy of the electron beam 14 incident on the wafer 6 relatively to 1 keV. In this state, a region (or CP exposure region) including the exposure patterns 31 to 33 obtained in step S4 is scanned with the electron beam 14 with an incident energy (or second incident energy) of 1 keV. Of secondary electrons and reflected electrons from the electron detector 11, secondary electrons mainly represent the exposed patterns. The detection signal is sent to the signal processing unit 120, which processes the signal and produces a potential contrast image as a secondary electron signal image. The secondary electron image data obtained in this way is stored in the secondary electron image memory 123.

Figure 6C:
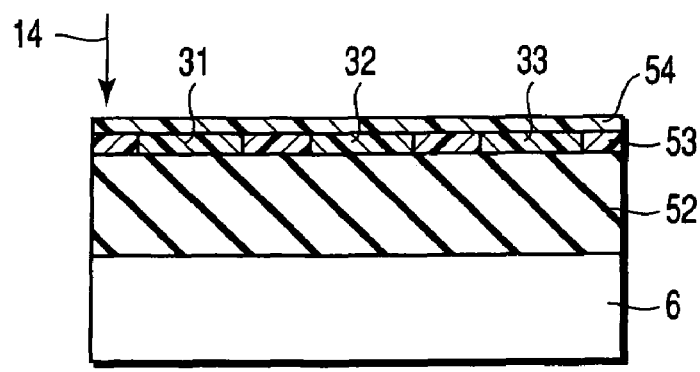

Referring to FIG. 6C, explanation will be given as to how secondary image data about CP patterns A to C are obtained by twice electron beam exposures in step S4 and step S5.

In step S4, an electron beam with a high energy is projected onto the insulation photosensitive resist 53 formed on the insulating film 52 on the semiconductor substrate 6 of FIG. 6A. Then, as shown in FIG. 6B, charged portions of the part where exposure patterns 33 are formed through the projection of the electron beam. For example, in the case of such a resist as a chemically amplified resist where sensitized material generates ions as a result of exposure, the conductivity of the exposed part increases. Therefore, the charges are accumulated at the exposed portions.

Then, the whole part is scanned with an electron beam with a low energy in step S5.

FIG. 6C is a sectional view of the specimen in step S5. In FIG. 6C, numeral 54 indicates a region (or scanning region) lightly re-exposed by the scanning of the electron beam 14 with the second incident energy (or low incident energy). Since the resist 53 is an insulating material or a dielectric material, scanning with such a low energy beam normally causes the charge of the electron beam to be accumulated at the surface of the resist 53. As a result, a shallow charged layer 54 is formed at the surface of the resist 53 as shown in FIG. 6C.

Since the part of the patterns 31 to 33 exposed with the first high energy as described above has a higher conductivity, the charge accumulated on the part leaks toward the substrate 6 into the patterns 31 to 33. As a result, the charges at the surface of the resist 53 corresponding to the patterns 31 to 33 are accumulated, resulting in a great contrast with the unexposed part in terms of the amount of charge at the surface. The emission efficiency of secondary electrons depends on the surface potential of the resist 53.

Therefore, when the whole part is scanned with the low energy electron beam for the second time, the amount of secondary electrons detected by the electron detector 11 corresponds to the exposure pattern formed at the resist 53. As a result, the electron detector 11 detects exposure patterns in the form of the strength and weakness of a secondary electron signal.

While in the embodiment, a resist where the conductivity of the exposed part varies according to exposure has been used, such an insulating film as an Si dioxide film may be used instead of the photosensitive resist 53. In the case of the Si dioxide film, many charges are accumulated in the part on which the electron beam has been projected. Consequently, the exposed part has a negative potential with respect to the unexposed part, resulting in a contrast in the surface potential. In this case, too, the exposure patterns are detected in the form of the strength and weakness of the secondary electron signal.

Specifically, in FIG. 6C, inside the re-exposed region 54 shallowly formed at the surface of the resist layer 53, the permittivity of the part in which exposure patterns 31 to 33 have been formed differs from that of the unexposed part. Therefore, when scanning is done with the electron beam 14 with an incident energy of 1 keV, the electric field appearing between the wafer 6 and the surface of the layer varies with the permittivity and therefore the amount of electrification varies from region to region. The difference in the amount of electrification causes a voltage contrast. As a result, the amount of secondary electrons generated as a result of the scanning of the electron beam 14 varies with the voltage contrast, thereby forming electron signal image data at the signal processing unit 120 according to the amount of electrons detected according to the exposure patterns 31 to 33.

The electron signal image obtained at the signal processing circuit 120 according to the difference in the amount of electrification between the exposure patterns 31 to 33 on which the electron beam 14 has been projected and the unexposed region at the resist layer 53, that is, the difference in surface potential between the exposed regions 31 to 33 and the unexposed region, is defined as a voltage contrast image.

The secondary electron image data about the patterns A to C obtained in this way is stored in the secondary electron image memory 123 in step S6.

Since each side of the square including the exposure patterns 31, 32, and 33 was 5 μm in length, the scanning area of the electron beam 14 was set to 20 μm□. To obtain an electron signal image, a special CP mask was selected and beam scanning was so effected that the electron beam 14 with the second incident energy took the form of a round beam of about 0.05 μm φ on the wafer 6.

As shown in FIG. 5B, it is assumed that, as shown by arrows 41' and 42', the positions of exposure patterns B and C have deviated from the normal positions shown by broken lines to the positions shown by solid lines with respect to the exposure pattern 31 corresponding to CP pattern A, a reference pattern. Specifically, relative vectors 41' and 42' representing the positional relationship between pattern 31 and actual exposure patterns 32', 33' obtained by exposure using exposure patterns B and C are determined as data representing a shift in position. Since the exposure pattern 31 is obtained with CP pattern A subjected to absolute position correction, it has no shift in position. Exposure patterns 32' and 33' have a shift in position.

For example, the secondary electron image data including the CP patterns A, B and C is read from the memory 123. At the same time, in step S7, the normal template image data 32 corresponding to CP pattern B is read from the template image memory 125. Then, Both of these data are sent to the pattern matching circuit 130.

In the pattern matching with respect to the exposed pattern 32', for example, the template image data corresponding to the pattern 32 is moved sequentially with respect to the detected image data of the pattern 32' to find out a matching position. The position data at which the matching is completed is read out at the signal processing control circuit 124. The position data about the template image pattern which has matched with the pattern 32 is the position of exposure pattern 32' to be determined. As a result, in step S9, the position data about exposure pattern 32' is obtained. The position data passes through the signal processing control circuit 124 and is stored in the data storage memory 131.

Similarly, as for all the exposure patterns including the remaining selected exposure patterns 31 and 33, the processes in step S7 and step S9 are carried out. When the fact that the position data about the exposure patterns for all of the N number of CP patterns selected in step S10 has been stored in the data storage memory 131 is detected, the process proceeds to step S11.

In this state, for example, the ideal or designed position data about exposure patterns A, B and C as shown in FIG. 5A is read. On the other hand, the position data about reference pattern 32' is read from the data storage memory 131 and sent via the I/F 132 to the control computer 129. The control computer 129, in step S12, calculates data about the amount of a shift in position corresponding to the vector 43 shown in FIG. 5B.

Then, the control computer 129 calculates an offset or a correction value for correct the difference in position between pattern 32 and pattern 32' on the basis of the data about the amount of a shift in position obtained in step S12. The data about the correction value calculated for exposure pattern B is stored in the memory of the control computer 129 or in the data storage memory 131.

Similarly, data about the correction value for exposure pattern C is calculated in step S11 to S13 from the position of reference exposure pattern 33 and that of exposure pattern 33' shown in FIG. 5B. The result is stored in a specified memory.

When the fact that, of the selected N exposure patterns, the data about the correction values for (N−1) exposure patterns excluding the reference pattern have been stored in the memory is detected in step S14, the process of obtaining the exposure parameter data is completed.

Thereafter, the application of a voltage from the power supply 16 is stopped. With a desired acceleration voltage, the exposure pattern 5a of the second aperture mask 5 is exposed in FIG. 1. At this time, the corresponding correction value data is read from a specific memory in step S15. As a result, the position of the CP exposure pattern on the wafer 6 is corrected with the electron beam 14 by, for example, driving the deflectors 4a, 4b, which enables the exposure patterns 32, 33 to be exposed in the proper positions with respect to the reference pattern 31 in step S16 as shown in, for example, FIG. 5C.

Hereinafter, operational advantages obtained when exposure in the first embodiment is made will be described.

(1) Firstly, it is not necessary to measure the shape of the beam using a microscopic mark differently from the prior art. In the prior art, it takes several minutes to measure the shape of the beam for each CP pattern. Thus, it is difficult to adjust several hundred CP patterns in a short time. In the first embodiment, however, the relative position between CP patterns can be measured only by an ordinary exposure process, which enables very high speed processing. As a result, the productivity in electron beam exposure can be improved.

(2) Secondly, the first embodiment may be applied to a case where the surface of a specimen to be exposed is made of a dielectric material, or a chargeable material. For pattern transfer, a resist, a dielectric material, is normally applied to a wafer to be exposed. This means that the position between CP patterns can be corrected using the wafer to be exposed. In the conventional method using a microscopic mark, corrections were needed as a result of adjusting the height of the microscopic mark and that of the wafer to be exposed. In contrast, with the first embodiment, since adjustment can be made at the wafer to be exposed, the drawing accuracy can be improved.

(3) Thirdly, all beam adjustments in the first embodiment can be made consecutively in the exposure apparatus. Moreover, the processing can be done at very high speeds. Consequently, the beam can be corrected easily during drawing. This makes it possible to shorten remarkably the time from when the beam is corrected until exposure is started and reduce sufficiently the change of the exposure apparatus with time after beam correction. Accordingly, it is possible to increase the drawing accuracy remarkably as compared with the prior art.

With such a configuration, since only one scanning is needed to determine exposure parameters used to adjust a plurality of CP patterns in an exposure mask, it is possible to adjust the selected exposure patterns in a short time.

The reason why only one scanning is needed is that scanning with a charged beam whose incident energy is lower than that of the charged beam projected in forming an exposure pattern prevents the exposure pattern from disappearing and that the amount of electrification in the sensitized area of an exposure pattern (composed of an area sensitized by a charged beam and an unsensitized area) differs from that in the unsensitized area, which produces an electron signal image corresponding to the exposure pattern.

Figure 7:
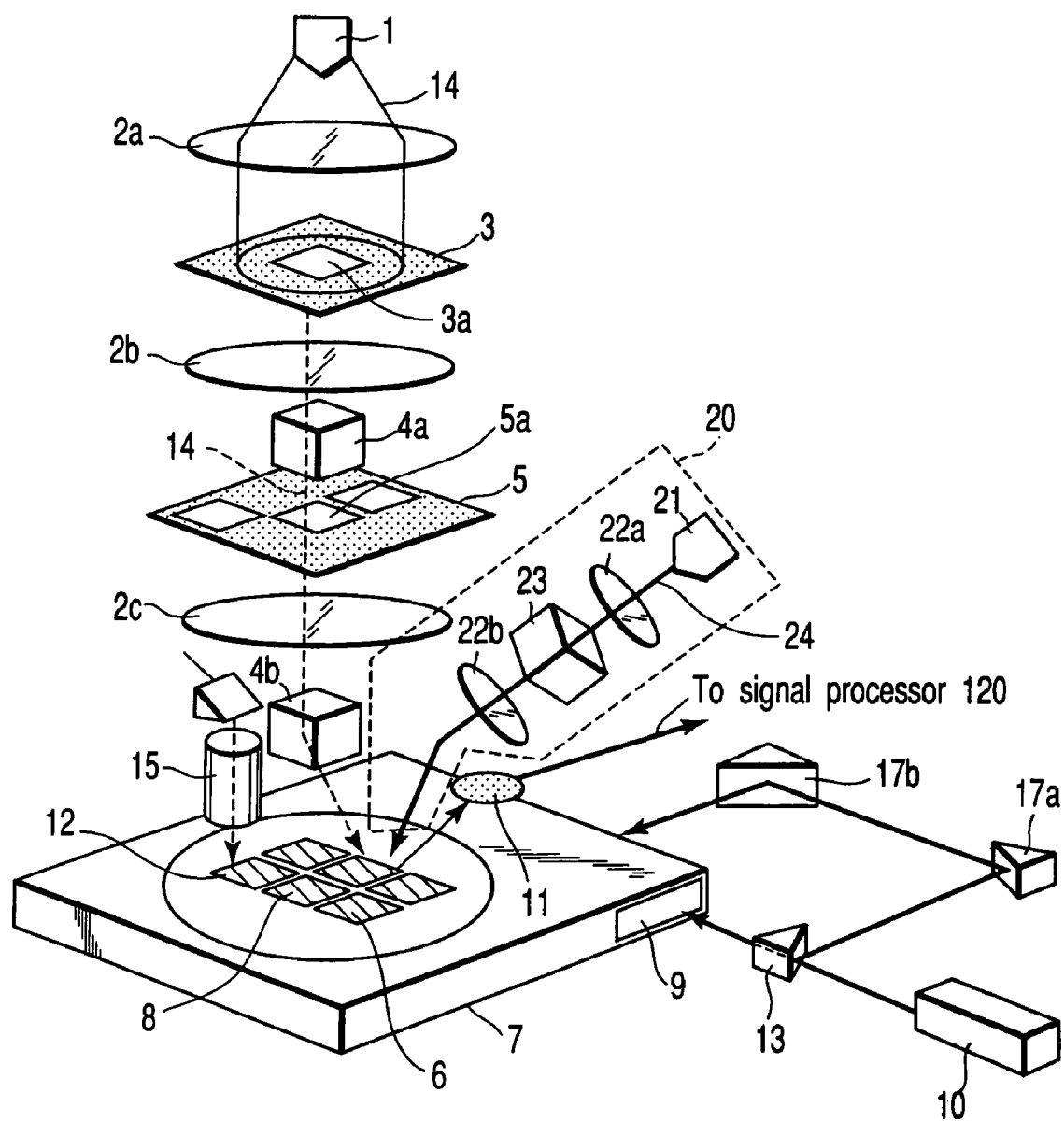
FIG. 7 schematically shows an electron beam exposure apparatus used in a modification of the first embodiment.

Next, another embodiment of the exposure apparatus and method will be explained. While in the above embodiment, the electron beam exposure apparatus of FIG. 1 has been used, an electron beam exposure apparatus shown in FIG. 7 may be used. This apparatus uses an observation SEM (scanning electron microscope) 20 as a pattern observation electron beam scanning section instead of using the power supply 16 shown in FIG. 1 which applies a voltage to the wafer 6. The observation SEM 20, which includes an electron gun 21, a lighting and objective system 22a, 22b, and a deflector 23, can scan a desired area on the wafer 6 with the electron beam 24 with an acceleration voltage of 1 kV. Although the observation SEM 20 is used as the electron beam scanning section, the present invention is not limited to this. For example, the observation SCM 20 may be useful in conjunction with the power supply 16.

While in the above exposure method, the exposure pattern for the CP pattern subjected to absolute position correction is used as a reference pattern and a relative shift in position of the exposure pattern for the CP pattern to be corrected from the reference pattern is determined, another method may be used. For instance, a mark (or reference mark) formed on a dielectric material may be used as a reference pattern and the amount of the shift of a CP pattern to be corrected from the reference mark may be determined.

Hereinafter, this modification will be explained concretely using a case where the electron beam exposure apparatus of FIG. 1 is used.

Figure 8A:
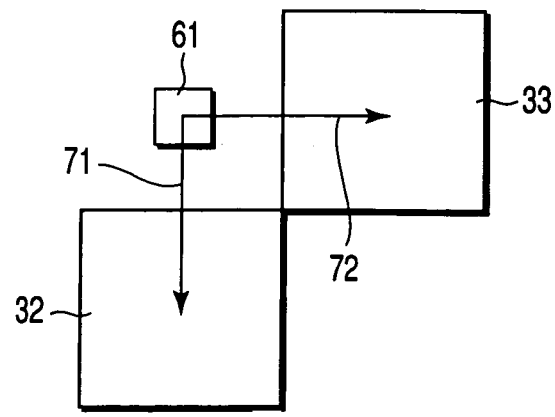
FIGS. 8A to 8C are diagrams to help explain a method of correcting the exposure position of a CP pattern related to the modification of FIG. 5.
Figure 8B:
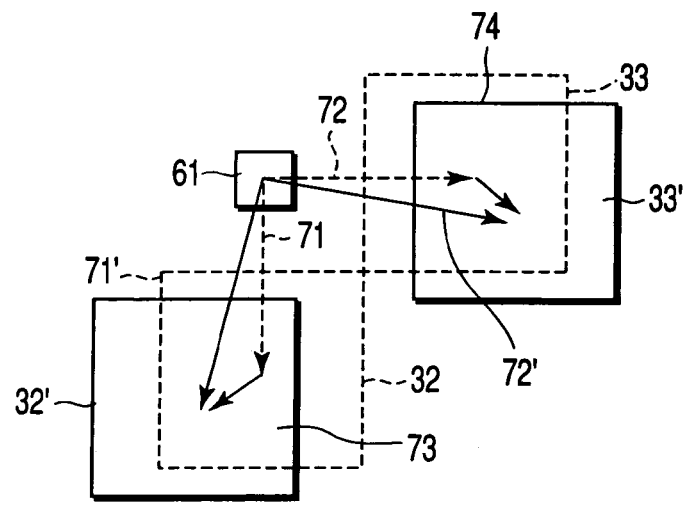
Figure 8C:
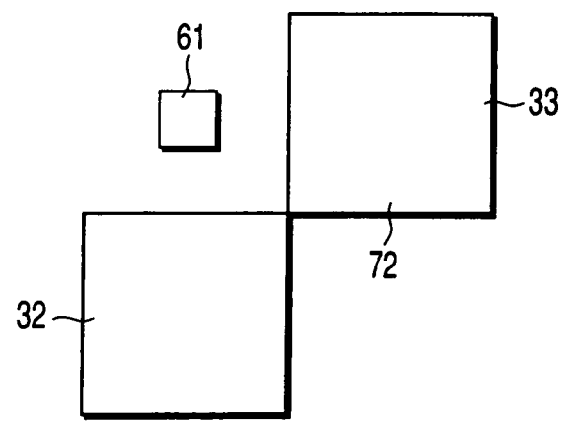

FIGS. 8A to 8C show drawings corresponding to FIGS. 5A to 5C. In FIGS. 8A to 8C, the parts corresponding to those in FIGS. 5A to 5C are indicated by the same reference numerals and a detailed explanation of them will not be given. Similarly, in the drawings after FIGS. 8A to 8C, the same reference numerals as in the preceding drawings indicate the corresponding parts and a detailed explanation of them will not be given.

FIG. 8A shows a reference mark 61, an exposure pattern 32, and an exposure pattern 33. The reference pattern 61 is a pattern serving as a reference in correcting absolute positions. The exposure patterns 32, 33 show the exposure patterns for CP patterns B and C to be corrected.

FIG. 8A shows an ideal positional relationship between reference mark 61 and exposure patterns 32, 33 when the position of CP pattern B and that of CP pattern C have been corrected ideally. In FIG. 8A, arrows 71 and 72 are relative vectors showing the positional relationship between reference mark 61 and exposure pattern 32 and between reference mark 61 and exposure pattern 33.

Figure 9A:
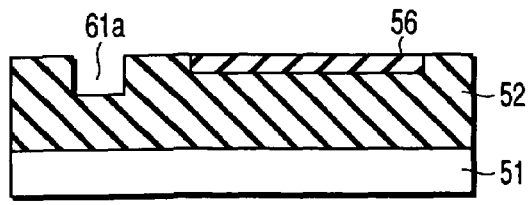
FIGS. 9A to 9F are sectional views showing various specimens (or exposed substrates) usable in the modification of FIG. 8.
Figure 9D:
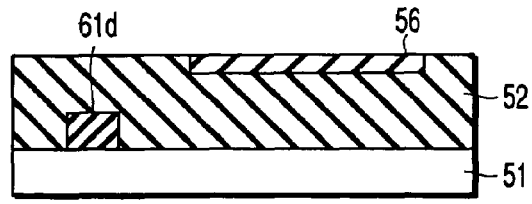
Figure 9B:
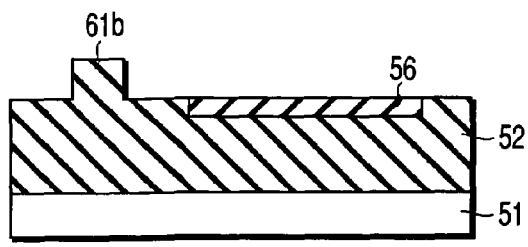
Figure 9E:
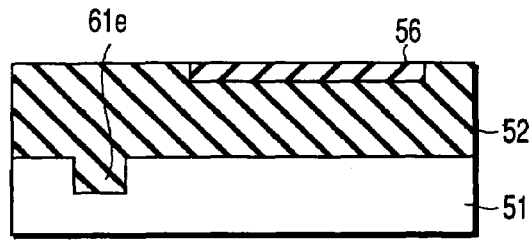
Figure 9C:
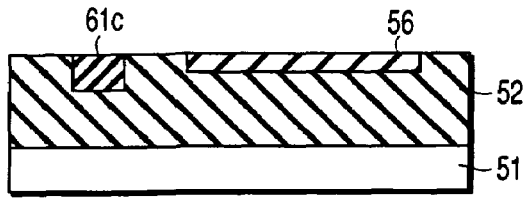
Figure 9F:
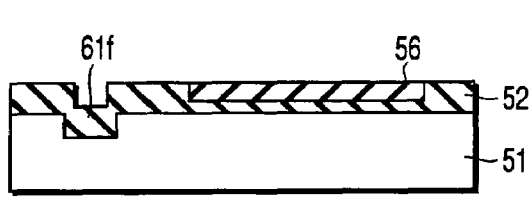

FIGS. 9A to 9F show concrete examples of a reference mark. In FIG. 9A, a groove 61a in the surface of an insulating film 52, such as a silicon oxide film, is used as a reference mark. In FIG. 9B, a projecting pattern 61b at the surface of the insulating film 52 is used as a reference mark. In FIG. 9C, a conductive member 61c buried in a groove in the surface of the insulating film 52 and made of a different material from that of the insulating film 52 is used as a reference mark. In FIG. 9D, a conductive member 61d provided in a deep position from the flat surface of the insulating film 52 and made of a different material from that of the insulating film 52 is used as a reference mark. In FIGS. 9E and 9F, a groove 61e and a groove 61f in the surface of an Si substrate 51 are used as a reference mark, respectively. FIG. 9E shows a case where the insulating film 52 buried in the groove 61e is thick and has a flat surface. FIG. 9F shows a case where the insulating film 52 buried in the groove 62f is thin and has a recessed part at its surface corresponding to the groove 61f. Numeral 56 in the figure indicates a charged area formed by exposure at the surface of the specimen.

In this modification, a CP beam positioning method (or a beam correction method) is carried out as follows. The method is basically the same as in the above embodiment.

First, a plurality of CP patterns to be corrected are selected. For example, CP patterns B and C are selected as CP patterns to be corrected.

Then, the electron beam 14 with an incident energy (or a first incident energy) of 5 keV is projected onto a wafer (or specimen) 6 via CP pattern B and CP pattern C on the basis of design data, thereby forming exposure patterns 32, 33.

Next, using the power supply 16, a voltage of 4 kV is applied to the wafer 6. As a result, the energy of the electron beam 14 incident on the wafer 6 decreases to 1 keV. In this state, the SCM image including the reference mark 61, exposure pattern 32, and exposure pattern 33 is obtained. A detector 11 and a signal processing unit (not shown) obtain an electron signal image (or a potential contrast image).

Next, as shown in FIG. 8B, the positional relationship (=relative vector 71') between the reference mark 61 and exposure pattern 32' is determined on the basis of the obtained electron signal image.

To determine the degree of a shift in position, the difference between the exposure pattern 32 and the exposure pattern 32' (=relative vector 71'—relative vector 71=vector 73) is found. As a result, the amount (Δx, Δy) of correction of the position of CP pattern B necessary to cause exposure pattern 32' to coincide with exposure pattern 32 is obtained. In measuring the position of the pattern at that time, known pattern matching using each CP pattern figure as a template file was used. Similarly, the amount of correction of the position is determined for the remaining selected exposure pattern 33.

Next, the application of a voltage from the power supply 16 is stopped. With a desired acceleration voltage, the position of each CP pattern is corrected on the wafer 6 (or on the surface of the specimen) on the basis of the amount of correction of each position, thereby forming exposure patterns 32 and 33 in desired positions as shown in FIG. 8C. This modification also produces the same effect as in the embodiment.

While in the embodiment, the position of a CP pattern, one of the exposure parameters, has been corrected, the present invention may be applied to the correction of another exposure parameter.

Figure 10A:
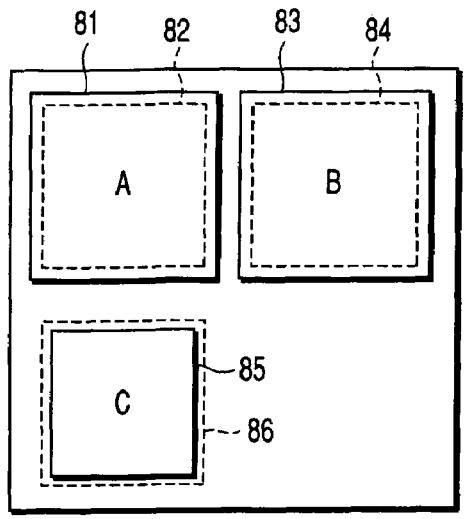
FIGS. 10A and 10B are diagrams to help explain method of correcting the magnification and rotation of a CP pattern related to another modification of the first embodiment.
Figure 10B:
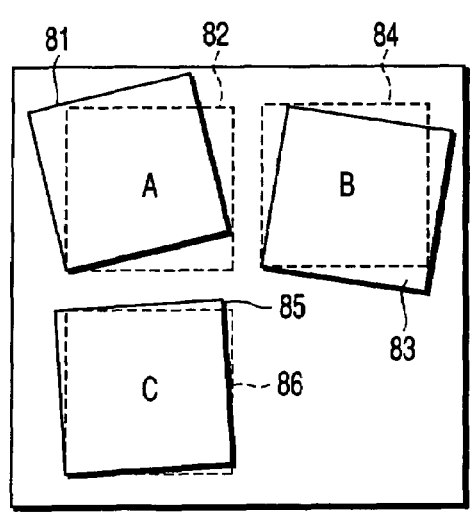

For example, as shown in FIG. 10A, the magnification of a CP pattern may be corrected using known pattern matching on the basis of the obtained electron signal image. Moreover, as shown in FIG. 10B, the rotation of a CP pattern may be corrected using known pattern matching on the basis of the obtained electron signal image. In FIGS. 10A and 10B, exposure patterns 82, 84, and 86 show ideal exposure patterns. In FIG. 10A, exposure patterns 81, 83, and 85 represent enlarged and reduced patterns actually obtained through exposure. FIG. 10B shows rotating patterns obtained through exposure.

SECOND EMBODIMENT

In the first embodiment, the method of correcting the position of a CP pattern has been explained. The present invention may be applied to a method of correcting the focal point of a CP pattern as one of a positional data. Hereinafter, using FIGS. 11A to 1E, a method of adjusting the focal point according to the present invention will be explained. A case where the electron beam exposure apparatus of FIG. 1 is used will be explained.

Figure 11A:
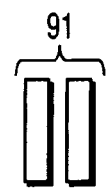
FIGS. 11A to 11E are diagrams to help explain a method of correcting the focal point of a CP pattern related to another embodiment of the present invention.

First, a CP pattern whose focal point is to be adjusted is selected. As shown in FIG. 11A, a line-and-space pattern is selected as a CP pattern. 91 to be subjected to focus adjustment.

Figure 11B:
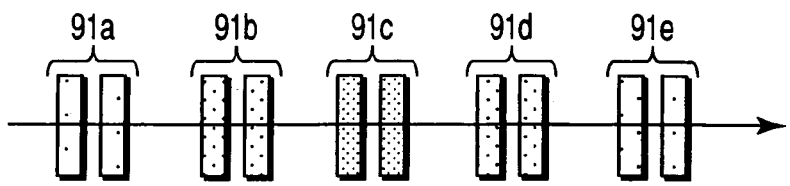

Next, with an incident energy of 5 keV, an exposure pattern for a CP pattern 91 is formed on a specimen wafer 6 on which an insulating film 52 has been formed as in the fist embodiment. At this time, as shown in FIG. 11B, the position of the focal point and the position of exposure on the surface of the specimen 6 are changed so as to form five exposure patterns 91a to 91e. A silicon oxide film is used as the insulating film 52.

Then, with the power supply 16, a voltage of 4 kV is applied to the wafer 6. As a result, the energy of the electron beam 14 incident on the wafer 6 decreases to 1 keV. In this state, an area including exposure patterns 91a to 91e are scanned one-dimensionally (or linearly), thereby detecting the electron signal images of the exposure patterns 91a to 91e at a time.

Figure 11C:
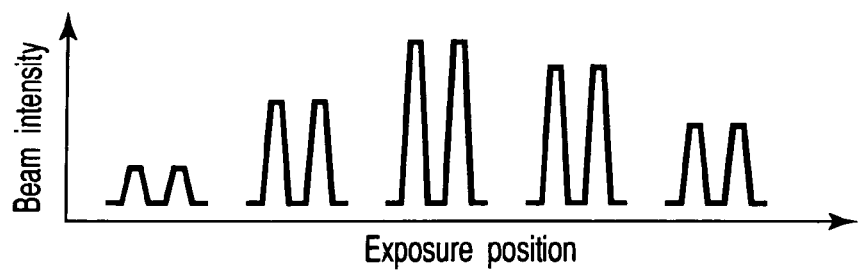

FIG. 11C shows an intensity distribution of an exposure beam for each of the CP patterns 91a to 91e. When an exposure beam is projected onto the surface of the insulating film 52, a potential distribution dependent on the beam intensity distribution is formed at the surface of the insulating film 52. Scanning the surface of the insulating film 52 with an electron beam with a low energy of about 1 keV enables a secondary electron signal to be obtained according to the surface potential distribution. As a result, a secondary electron signal distribution can be obtained as shown in FIG. 11D.

Figure 11D:
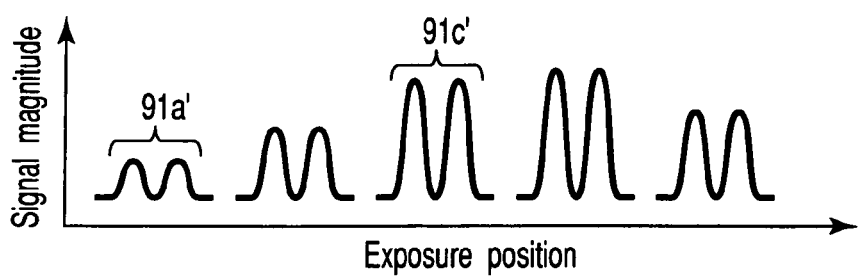
Figure 11E:
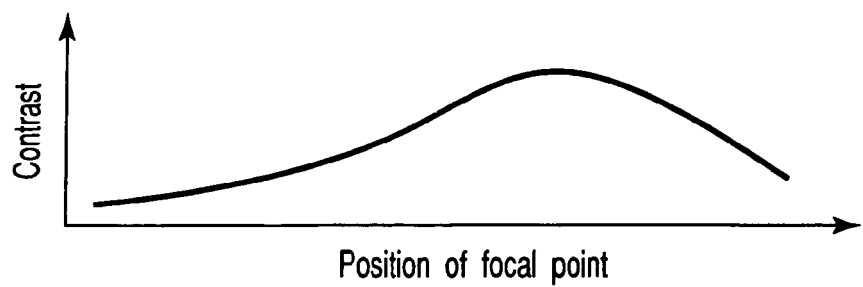

In FIG. 11D, numeral 91c' indicates a secondary electron signal distribution when the electron beam is best focused. Numeral 91a' indicates a secondary signal distribution when the beam is most out of focus. For example, plotting the contrast of the secondary electron signal obtained at the position of each focal point produces the relationship between the position of the focal point and the contrast as shown in FIG. 11E. In the plotting of FIG. 1E, the steepest part of the secondary electron signal (a hill part of the secondary electron signal where the maximum value—minimum value of the signal strength becomes the largest), that is, a part as shown by 91c' in FIG. 11D, is found, thereby determining the optimum position of the focal point.

Thereafter, the application of a voltage from the power supply 16 is stopped. With a desired acceleration voltage, the CP pattern is exposed on the basis of the optimum position of the focal point.

The second embodiment provides the same operational advantages (1) to (3) as in the first embodiment. While in the second embodiment, the optimum position of the focal point has been determined on the basis of the contrast of the secondary electron signal, it may be determined in another way. For instance, the inclination (or the beam resolution) of the secondary electron signal may be found, thereby determining the optimum position of the focal point.

THIRD EMBODIMENT

Figure 12:
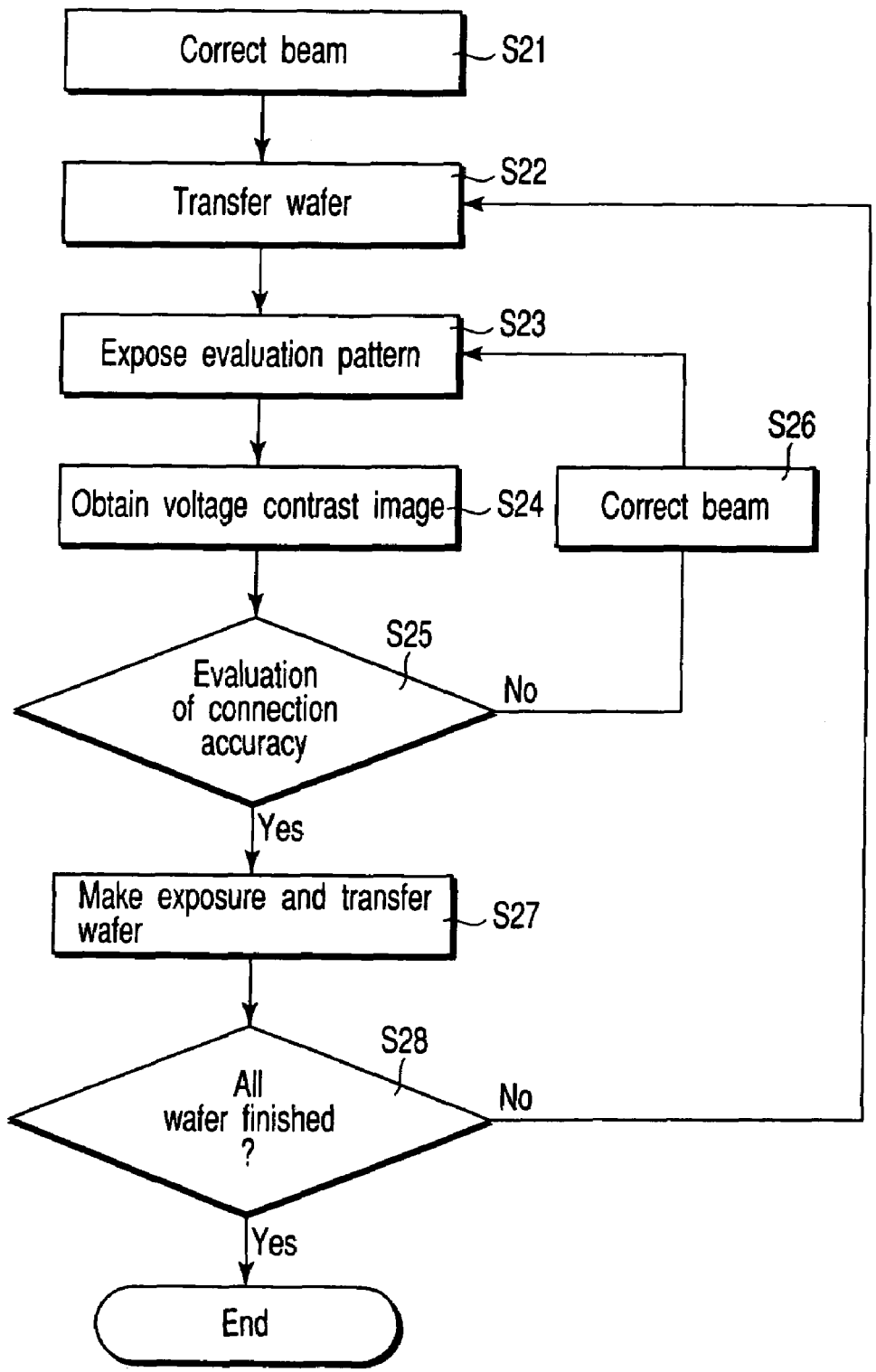
FIG. 12 is a flowchart to help explain a method of evaluating the accuracy of connection between patterns in charged beam exposure to detect a shift in the connection between CP patterns in still another embodiment of the present invention.

In a third embodiment of the present invention, a case where the present invention is applied to a method of evaluating the accuracy of connection (or stitching accuracy) between patterns in charged beam exposure will be explained by reference to FIGS. 12, 13A, and 13B. A variably shaped, CP electron beam exposure apparatus with an acceleration voltage of 50 kV is used. The basic configuration of the apparatus is the same as that of the electron beam exposure apparatus of FIG. 7.

Hereinafter, a method of evaluating the accuracy of connection between patterns in the third embodiment will be explained by reference to a flowchart in FIG. 12. First, the beam for each CP pattern is corrected (step S21) and a wafer is transferred (step S22).

Next, a CP connection evaluation mask is selected as a CP pattern. An electron beam with a first incident energy is projected via the mask onto a chip, thereby exposing the CP connection evaluation pattern, which produces an exposure pattern (step S23).

Figure 13A:
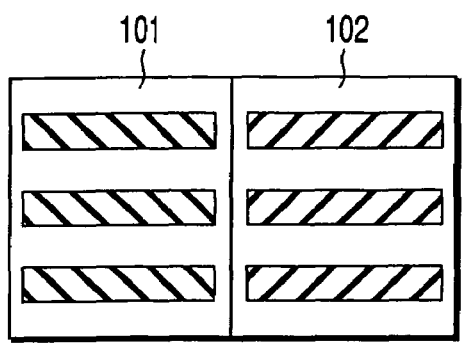
FIGS. 13A and 13B show exposure patterns to help explain an evaluation method in the embodiment of FIG. 12.
Figure 13B:
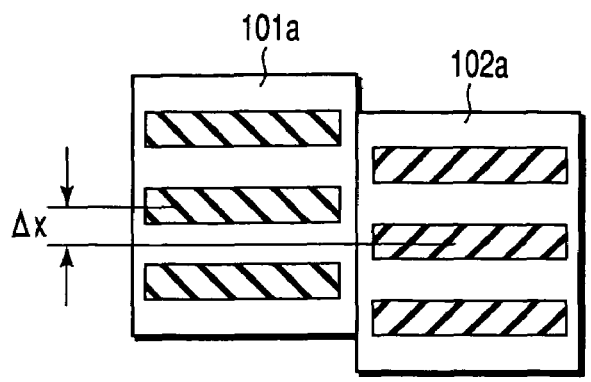

FIG. 13A shows the positional relationship between exposure patterns 101 and 102 when the CP connection evaluation pattern has been exposed ideally. FIG. 13B shows the positional relationship between exposure pattern 101a and exposure pattern 102b which have been actually exposed. In FIG. 12B, Δx indicates a shift (an exposure parameter related to position) in the connection between exposure pattern 101a and exposure pattern 102b.

Next, using an observation SEM 20, electron signal images (or potential contrast images) of exposure pattern 101a and exposure pattern 102b are obtained (step S24). The incident energy (or a second incident energy) of the electron beam used for the observation SEM 20 is lower than the first incident energy.

Next, the accuracy of the connection between exposure pattern 101a and exposure pattern 102b is evaluated (step S25). If the result of the evaluation has exceeded a specified value, the beam is corrected (step S26) and the accuracy of the connection is evaluated again. If the result of the evaluation is within the specified value, the exposure is continued and thereafter the wafer 6 is carried out (step S27). The remaining wafers are also subjected to steps S22 to S27.

Hereinafter, the operational advantages in making exposure in the third embodiment will be described.

In correcting the CP beam in the prior art, a wafer (or specimen) was put outside an exposure apparatus. After processes, including development, were carried out, the accuracy of the connection of patterns was measured. In the third embodiment, however, the accuracy of the connection between patterns can be evaluated without putting the wafer outside the exposure apparatus. This enables the beam accuracy to be evaluated precisely, which improves the productivity.

Since the above approach enables exposure to be made in the optimum state all the time, a high-accuracy drawing can be performed. The above-described process has only to be carried out according to a predetermined sequence in the course of exposing the wafer (or specimen). For instance, making an evaluation before starting to expose each wafer enables a high-accuracy exposure to be realized.

While in the third embodiment, a special pattern has been used in evaluating the connection, the present invention is not limited to the shape of the pattern. Even when a pattern of another complex shape is used, the connection can be evaluated.

Figure 14A:
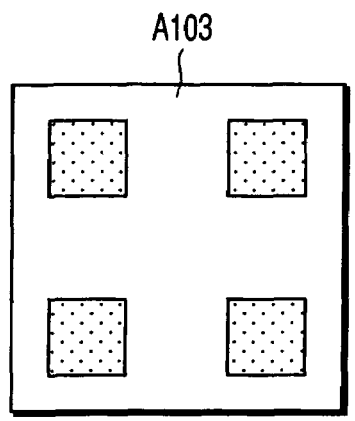
FIGS. 14A to 14D show CP patterns to help explain a modification of the embodiment of FIG. 12.
Figure 14B:
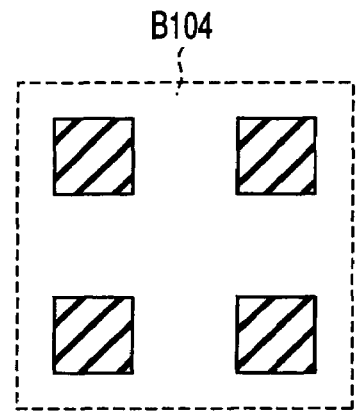
Figure 14C:
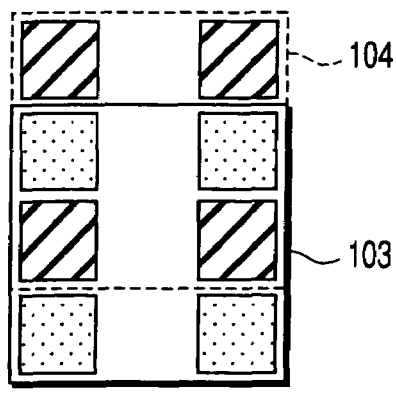
Figure 14D:
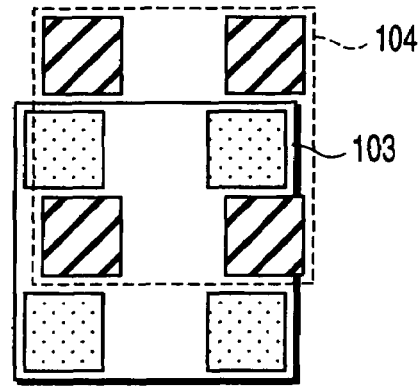

For instance, CP pattern A103 and CP pattern B104 as shown in FIGS. 14A and 14B may be used. As shown in FIGS. 14C and 14D, exposure pattern 103 and exposure pattern 104 are arranged in a nesting manner. With this nest of patters, the surface of the dielectric material, such as the insulating film 52, is exposed. Use of this method enables the total exposure area of the pattern to be saved. This makes it possible to measure many exposure patterns simultaneously.

The present invention is not limited to the above embodiments. For instance, the invention is not restricted by the shape of the beam used in the charged beam exposure apparatus. As for the electron beam with the first incident energy, the invention may be applied to a variably shaped beam, a round beam, a penetrating beam from a reduced or one-fold projection mask, and a scattered beam. Furthermore, as for the electron beam with the second incident energy, an exposure pattern may be observed (or an electron signal image may be obtained) with an CP beam other than a round beam or a rectangular beam. A pattern (or an aperture) for forming a CP beam or a rectangular beam is formed in a second aperture beforehand.

In addition, the present invention is not limited to the shape or size of a CP pattern to be evaluated.

Figure 15:
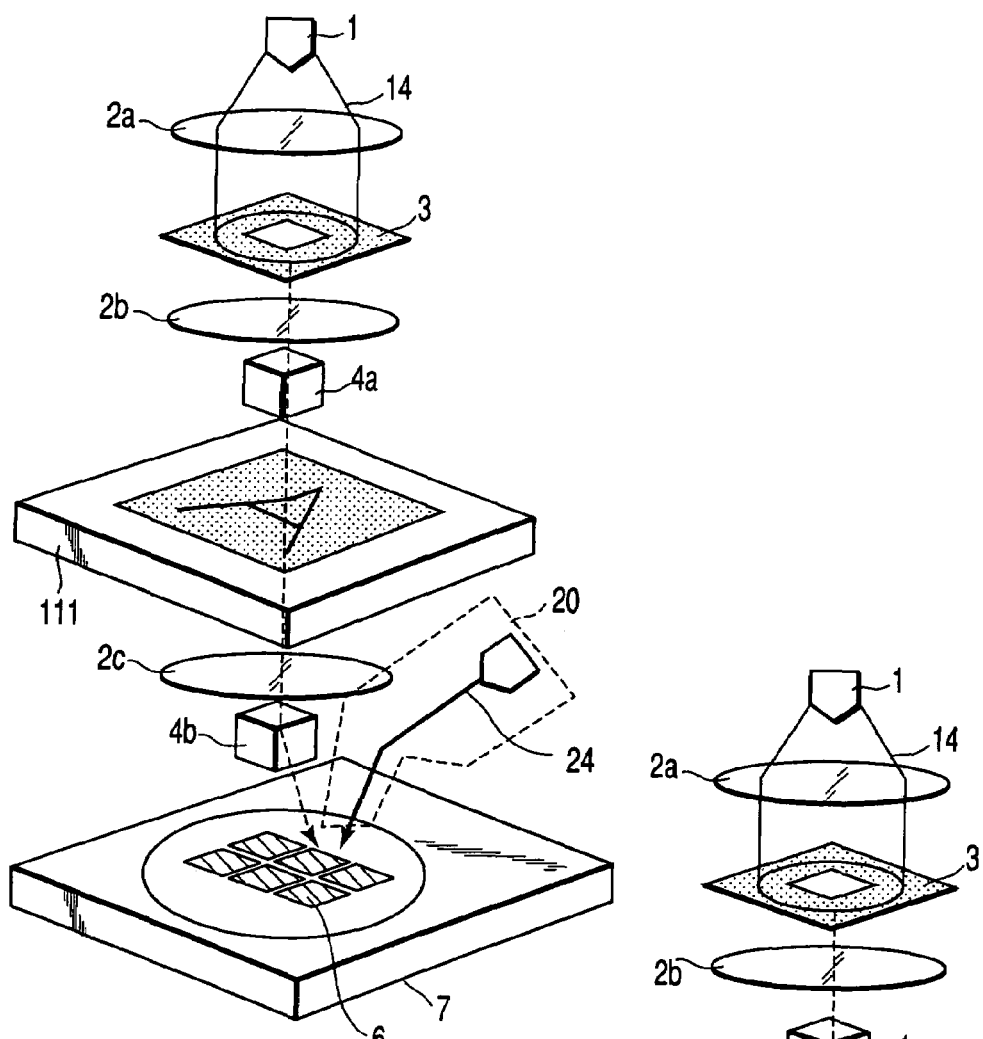
FIG. 15 schematically shows a reduced projection charged beam exposure apparatus usable in an embodiment of the method related to the present invention.
Figure 16:
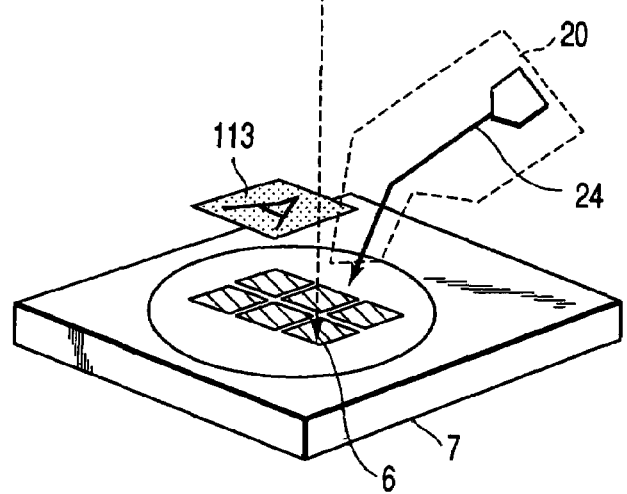
FIG. 16 schematically shows a one-fold projection charged beam exposure apparatus usable in another embodiment of the method related to the present invention.

Furthermore, the present invention is not limited to the form of the charged beam exposure apparatus. For instance, the invention may be applied to the use of a reduced projection charged beam exposure apparatus which has a stencil or a membrane mask stage 111 and a penetration or membrane mask 112 at which all the desired circuit patterns have been formed as shown in FIG. 15, or to the use of a one-fold projection charged beam exposure apparatus with a one-fold transfer mask 113 as shown in FIG. 16.

Furthermore, the present invention is not limited to the acceleration voltage for the charged beam. The incident energy (or the first incident energy) of a charged beam for exposure may be 5 keV or less or 50 keV or more. In the step of obtaining an electron signal image, the incident energy (or the second incident energy) may be 1 keV or less or 1 keV or more. Here, the condition of the first incident energy>the second incident energy must be fulfilled.

The present invention may be applied not only to drawing directly on a wafer but also to exposure of a photomask. An object to be exposed is not limited to a wafer.

The invention may be applied to, for example, an exposure method using a charged beam other than an electron beam, such as an ion beam.

In the above embodiments, two or more exposure parameters, including position, focal point, astigmatism, rotation, and magnification, not one exposure parameter, may be obtained simultaneously. Thereafter, correction, evaluation, or exposure may be made.

The above embodiments include various stages of the invention. By combining a plurality of disclosed structural requirements suitably, various invention can be extracted. For instance, even when some are eliminated from all of the structural requirements, if the object of the present invention can still be achieved, the configuration less the eliminated structural requirements is extracted as an invention. In addition, the present invention may be practiced or embodied in still other ways without departing from the spirit or essential character thereof.

As has been described in detail, with the present invention, it is possible to realize a parameter exposure obtaining method useful in adjusting the exposure mask in a short time, an exposure parameter evaluating method, and a highly productive charged beam exposure method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged beam exposure method comprising:
    selecting a plurality of exposure patterns to be used for exposure from an exposure mask having a reference pattern whose exposure position has been corrected beforehand;
    forming a charged reference pattern and a plurality of charged exposure patterns on a to-be-exposed insulating substrate by projecting a charged beam with a first incident energy onto the insulating substrate via said reference pattern and said selected exposure patterns to be corrected;
    forming electron signal images for said charged reference pattern and said plurality of charged exposure patterns based on charged particles including secondary electrons from said exposed insulating substrate by scanning said exposed substrate with a charged beam with a second incident energy lower than said first incident energy;
    creating, based on said electron signal images, correction exposure parameters including at least one of position, focal point, astigmatism, rotation, and magnification for all of said selected exposure parameters to be corrected;
    correcting exposed exposure patterns using said exposure parameters; and
    exposing said exposure patterns on said exposed substrate with said charged beam so as to reflect the corrected exposure parameters.

2. The method according to claim 1, wherein said selected exposure patterns are character projection (CP) patterns.

3. A semiconductor device manufacturing method comprising:
    selecting a plurality of exposure patterns to be used for exposure from an exposure mask with a reference pattern whose exposure position has been corrected beforehand;
    forming a plurality of exposed patterns on the exposed semiconductor substrate by projecting a charged beam with a first incident energy onto the insulating exposed semiconductor substrate via said reference pattern and all of said selected exposure patterns to be corrected;
    obtaining electron signal images for said exposed reference pattern and said plurality of exposure patterns on the basis of charged particles including secondary electrons from said exposed semiconductor substrate by scanning said exposed semiconductor substrate with a charged beam with a second incident energy lower than said first incident energy;
    creating, based on said electron signal images, correction exposure parameters including at least one of position, focal point, astigmatism, rotation, and magnification for all of said selected exposure parameters to be corrected;
    correcting said exposed exposure patterns using said created exposure parameters; and
    exposing said exposure patterns on said exposed semiconductor substrate with said charged beam so as to reflect the corrected exposure parameters.

4. The method according to claim 3, wherein said selected exposure patterns are character projection (CP) patterns.

* * * * *